US007751917B2

(12) United States Patent
Rees et al.

(10) Patent No.: US 7,751,917 B2
(45) Date of Patent: Jul. 6, 2010

(54) OPTIMISATION OF THE DESIGN OF A COMPONENT

(75) Inventors: Janet Rees, Ayleburton (GB); Stephen M Bagnall, Thornbury (GB); Wenbin Song, Southampton (GB)

(73) Assignees: BAE Systems plc, London (GB); Rolls-Royce plc, London (GB)

(*) Notice: Subject to any disclaimer, the term of this patent is extended or adjusted under 35 U.S.C. 154(b) by 145 days.

(21) Appl. No.: 11/508,339

(22) Filed: Aug. 23, 2006

(65) Prior Publication Data
US 2007/0073429 A1    Mar. 29, 2007

Related U.S. Application Data

(63) Continuation of application No. 10/512,227, filed as application No. PCT/GB03/01802 on Apr. 25, 2003, now abandoned.

(30) Foreign Application Priority Data
Apr. 26, 2002    (GB)    ................. 0209543.8

(51) Int. Cl.
   *G06F 19/00*    (2006.01)
(52) U.S. Cl. .............. 700/97; 700/28; 700/98; 700/182; 703/6
(58) Field of Classification Search ............ 700/28, 700/29, 95, 97, 98, 103, 104, 117, 182, 30; 716/2; 703/1, 6, 2, 7, 8
See application file for complete search history.

(56) References Cited

U.S. PATENT DOCUMENTS

| | | | |
|---|---|---|---|
| 4,260,331 A | | 4/1981 | Goodwin |
| 4,417,854 A | * | 11/1983 | Cain et al. ............. 416/241 B |
| 5,452,238 A | | 9/1995 | Kramer et al. |
| 5,485,550 A | * | 1/1996 | Dalton .................... 706/52 |
| 5,886,908 A | | 3/1999 | Conn et al. |
| 5,936,863 A | * | 8/1999 | Kostelnik et al. ............ 703/6 |
| 6,290,464 B1 | * | 9/2001 | Negulescu et al. ........ 416/97 R |
| 6,393,331 B1 | * | 5/2002 | Chetta et al. ............... 700/97 |
| 6,587,741 B1 | * | 7/2003 | Chetta et al. ............... 700/97 |
| 6,625,507 B1 | * | 9/2003 | Dickerson et al. .......... 700/97 |
| 6,643,597 B1 | * | 11/2003 | Dunsmore ................ 702/104 |
| 6,944,580 B1 | * | 9/2005 | Blume et al. ................ 703/1 |
| 6,973,419 B1 | * | 12/2005 | Fortin et al. ................ 703/8 |
| 2003/0149502 A1 | * | 8/2003 | Rebello et al. ............. 700/98 |

OTHER PUBLICATIONS

Chapman, C.B., et al., "Design engineering—a need to rethink the solution using knowledge based engineering", *Knowledge Based Systems*, 12:257-267 (1999).

(Continued)

*Primary Examiner*—Charles R Kasenge
(74) *Attorney, Agent, or Firm*—Nixon & Vanderhye P.C.

(57) ABSTRACT

A method of optimising the design of a component is provided, in which a set of principal design variants is generated, the variants having design parameters which are common to all design variants of the set and some which differ between variants. Subsets of secondary design variants are generated by a computer executed rule based geometry engine, the subsets comprising at least one secondary design variant, generated by modifying at least one design parameter or design variable of the principal design variant.

21 Claims, 16 Drawing Sheets

OTHER PUBLICATIONS

Hsu, Y., "A review of structural shape optimization", *Computers in Industry*, 26:3-13 (1994).

Song, W., et al., "Turbine blade fir-tree root design optimisation using intelligent CAD and finite element analysis", *Computers & Structures*, 80:1853-1867 (2002).

Myung, S., et al., "Knowledge-based parametric design of mechanical products based on configuration design method", *Expert Systems with Applications*, 21:99-107 (2001).

* cited by examiner

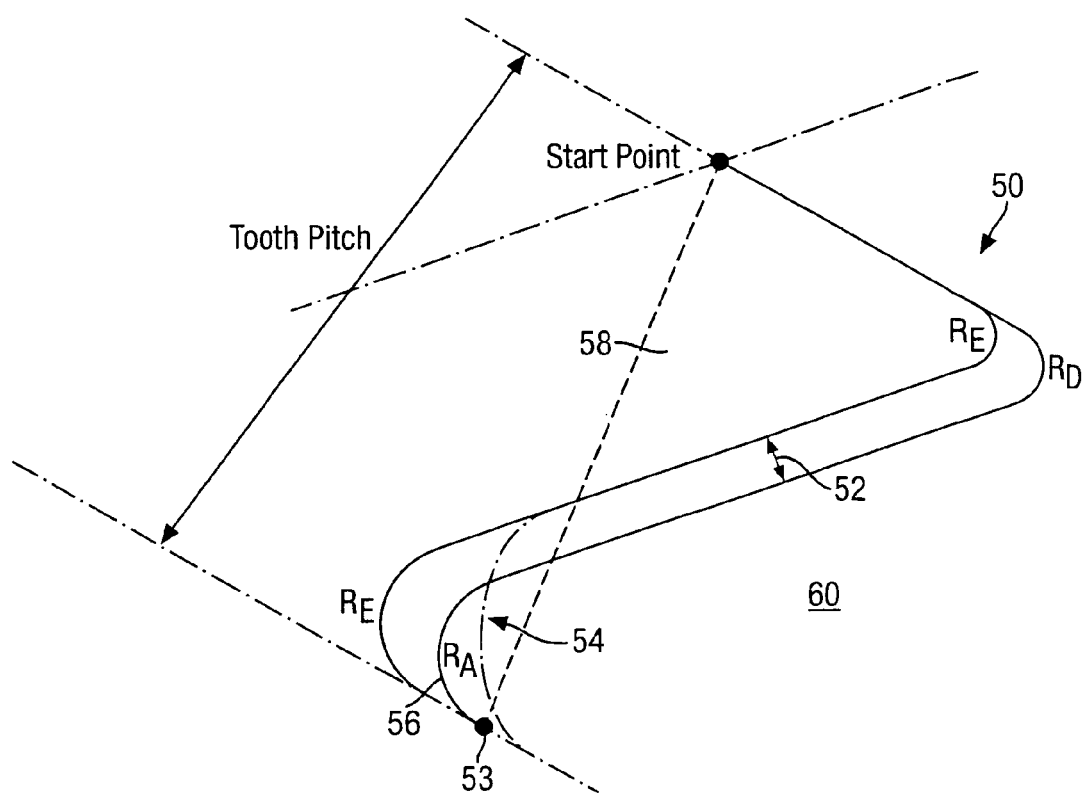

Fig.3.

Blade root / Disk head geometry parameters

| Variable | Name | Units | Type |
|---|---|---|---|
| Skew (β) | Root-skew-angle | degree | Variable |
| Nteeth | Number-of-teeth | | Variable |
| Rwa | Root-wedge-angle | degree | Variable |
| Alor(L) | Axial-length-of-root | mm | Variable |
| Snw | Shank-neck-width | mm | Variable |
| Fsw | Fir-tree-shoulder-width | mm | Variable |
| Rcrest | Fir-tree-tooth-crest-radius | mm | Variable |
| Rtrough | Fir-tree-tooth-trough-radius | mm | Variable |
| Bp1,2. | Blade-tooth-pitch | mm | Variable |
| Btcr | Bottom-tooth-crest-radius | mm | Variable |
| Cpw | Cooling-passage-width | mm | Variable |
| Bglr(R1) | Bucket-groove-lower-radius | mm | Variable |
| Bgur(R2) | Bucket-groove-upper-radius | mm | Variable |
| Dtp1,2. | Disk-tooth-pitch | mm | Variable |
| Fcrest | Disk-tooth-crest-radius | mm | Variable |
| Ftrough | Disk-tooth-trough-radius | mm | Variable |
| Nblades | Number-of-blades | | Parameter |
| Drad | Disk-radius | mm | Parameter |
| Ninc | Number-of-blades-inclusive | | Parameter |
| Rtsn | Radius-to-shank-neck | mm | Parameter |
| Snfr (R) | Shank-neck-fillet-radius | mm | Parameter |
| Tfa (φ) | Top-flank-angle | degree | Parameter |
| Ufa (γ) | Under-flank-angle | degree | Parameter |
| Ncfc | Non-contact-face-clearance | mm | Parameter |
| Bac (Ca) | Blade-axial-chord | mm | Parameter |
| Cpa | Cooling passage area | mm$^2$ | Parameter |
| Fdcr | First-disk-crest-radius | mm | Parameter |
| Inr | Inner-radius | mm | Parameter |
| Dhnw (D) | Disk-head-neck-width | mm | Derived |
| Bga | Bucket-groove-area | mm$^2$ | Derived |
| Bch (H) | Bottom-to-contact-height | mm | Derived |
| Bl | Bedding-length | mm | Derived |
| Fh | Fir-tree-height | mm | Derived |

Fig.6.

| Variables | Number of variables | |
|---|---|---|
| | 6 | 14 |
| *Tooth pfofile parameters* | | |
| root wedge angle (degree) | 20-40 | 20-40 |
| Tooth pitch (mm) | 2.0-4.0 | 2.0-4.0 |
| Blade crest radius (mm) | 0.2-1.0 | 0.2-1.0 |
| Blade trough radius (mm) | 0.2-1.0 | 0.2-1.0 |
| disk crest radius (mm) | 0.2-1.0 | 0.2-1.0 |
| disk trogh radius (mm) | 0.2-1.0 | 0.2-1.0 |
| *Fir-tree root/disk head parameters* | | |
| Skew angle (degree) | [15][1] | 10-20 |
| Axial length of root (mm) | [20] | 15-25 |
| shank neck width (mm) | [6.7615] | 6.5-7.5 |
| Firt-ree shoulder width (mm) | [9.8943] | 8-12 |
| bottom tooth crest radius (mm) | [1.0668] | 0.8-1.2 |
| cooling passage width (mm) | [1.3455] | 1.2-1.5 |
| bucket groove lower radius (mm) | [3.5] | 3.0-4.0 |
| bucket groove upper radius (mm) | [2.2] | 1.5-2.5 |

1. [ ] indicates values when used in optimisation

Fig.7.

| number | Constraints | Number of variables | |
|---|---|---|---|
| | | 6 | 14 |
| 1 | R1/R2 | X | X |
| 2 | H/D | X | X |
| 3 | DP/F | X | X |
| 4-5 | min<DP<max | X | X |
| 6 | Lca | X | X |
| 7 | RSA | X | X |
| 8 | minimum serration pitch | X | X |
| 9 | bottom neck width>pitch | X | X |
| 10 | minimum wall thickness | X | X |
| 11 | Bucket groove area>cooling passage area | X | X |
| 12-23 | Notch stresses | | X |
| 24-35 | Section stresses | X | X |
| 36-43 | Crushing stresses | X | X |
| 44-45 | Bucket groove stresses | X | X |
| 46-53 | Unzipping stresses | X | X |
| Objective function | | Maximum notch stress | Fir-tree Frontal area |

Fig.8.

Normalised constraint vector for the base design

| No | Name of constraint | Numeric values | | |
|---|---|---|---|---|
| | | Lower Bound | Value | Upper Bound |
| 1 | Ratio of R1 to R2 [R1/R2] | -1.0 | -0.8642 | - |
| 2 | Ratio of H to D [H/D] | -1.0 | -0.8955 | - |
| 3 | Ratio of R1 to disk trough [R1/Ftrough] | -1.0 | -0.5268 | - |
| 4 | Maximum ratio of tooth pitch to disk trough [DP/Ftrough(max)] | - | 1.4779 | 1.0 |
| 5 | Minimum ratio pitch to disk trough [DP/Ftrough(min)] | -1.0 | -0.5467 | - |
| 6 | Ratio of axial length to blade axial chord[LCA] | -1.0 | -0.4961 | - |
| 7 | Root Stagger Angle[RSA] | - | 0.7499 | 1.0 |
| 8 | Ratio of Blade/Disk serration pitch[PMIN] | -1.0 | -0.4540 | - |
| 9 | Ration of blade bottom neck width to tooth pitch[BNP] | -1.0 | -1.1474 | - |
| 10 | Minimum wall thickness of bottom blade notch[BNMIN] | -1.0 | -1.3038 | - |
| 11 | Ratio of bucket groove region area to cooling passage area[AR] | -1.0 | -1.0900 | - |
| 12-19 | Maximum blade notch stress[NBL(R)($2^1$)]$^2$ | -1.0 | 0.9270 | 1.0 |
| 20-23 | Maximum disk notch stress[NDL(R)(3)] | -1.0 | 0.9948 | 1.0 |
| 24-29 | Maximum blade section stress[SB(1)] | -1.0 | 0.6931 | 1.0 |
| 29-35 | Maximum disk section stress[SD(4)] | -1.0 | 0.5623 | 1.0 |
| 36-43 | Maximum crushing stress[CS(1)] | -1.0 | 0.6514 | 1.0 |
| 44-45 | Maximum bucket groove stress | -1.0 | 0.9023 | 1.0 |
| 46-53 | Maximum unzipping stress[UZP(1)] | -1.0 | 0.3688 | 1.0 |

1. The numbers in bracket indicate the no. of the tooth or the section where the maximum stress occurs.
2. For the purpose of compactness, only the maximum stresses are shown in the table.

Fig. 14.

Effect on stress distribution of design variables for the base design

| Geometry features | Unzip stress | Notch stress blade | Notch stress disk | Section stress blade | Section stress disk | Crushing stress |
|---|---|---|---|---|---|---|
| Skew angle | X | +[1] | + | + | X | 1+;restX |
| Shank neck width | - | x | 1+;restX | + | X | 1,4;restX |
| Blade shoulder width | + | - | 2,3+;rest- | 1+;rest+ | + | + |
| Bottom tooth crest radius | X | 2+;rest- | - | X | X | 4+;restX |
| Cooling passage width | X | 1,2+;rest- | 1-;2,3+ | + | X | 1,2+;3,4- |
| Bucket groove lower radius | X | X | X | X | X | X |
| Bucket groove upper radius | X | X | X | X | X | X |
| Tooth pitch | + | + | + | X | + | - |
| Blade crest radius | 1-;rest+ | - | + | X | X | + |
| Blade trough radius | - | + | - | X | X | 1,2-;3,4+ |
| Disk crest radius | 1-;rest+ | - | - | + | - | + |
| Disk trough radius | - | X | - | X | X | 4-;rest+ |

1. + Indicates increase, - Indicates decrease, X Means no significant effect when variable increases, number indicates the tooth number in top-down order

Fig. 15.

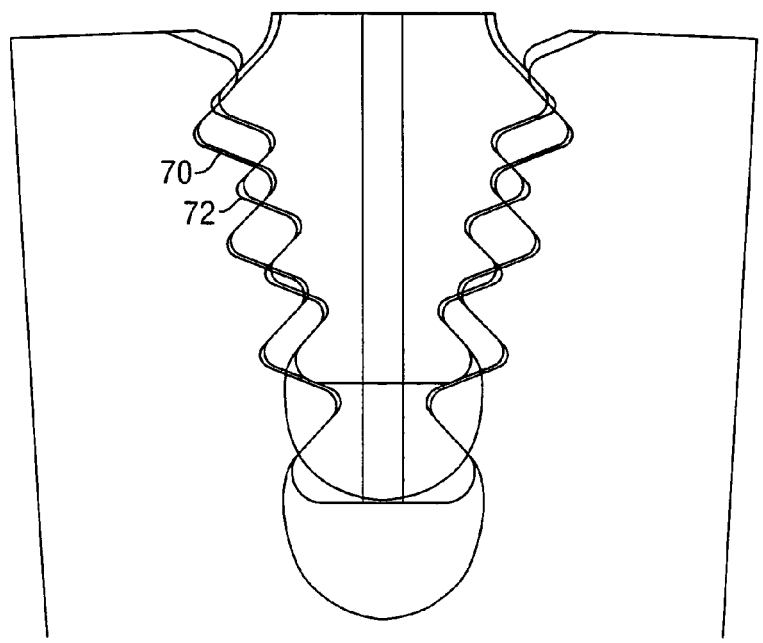

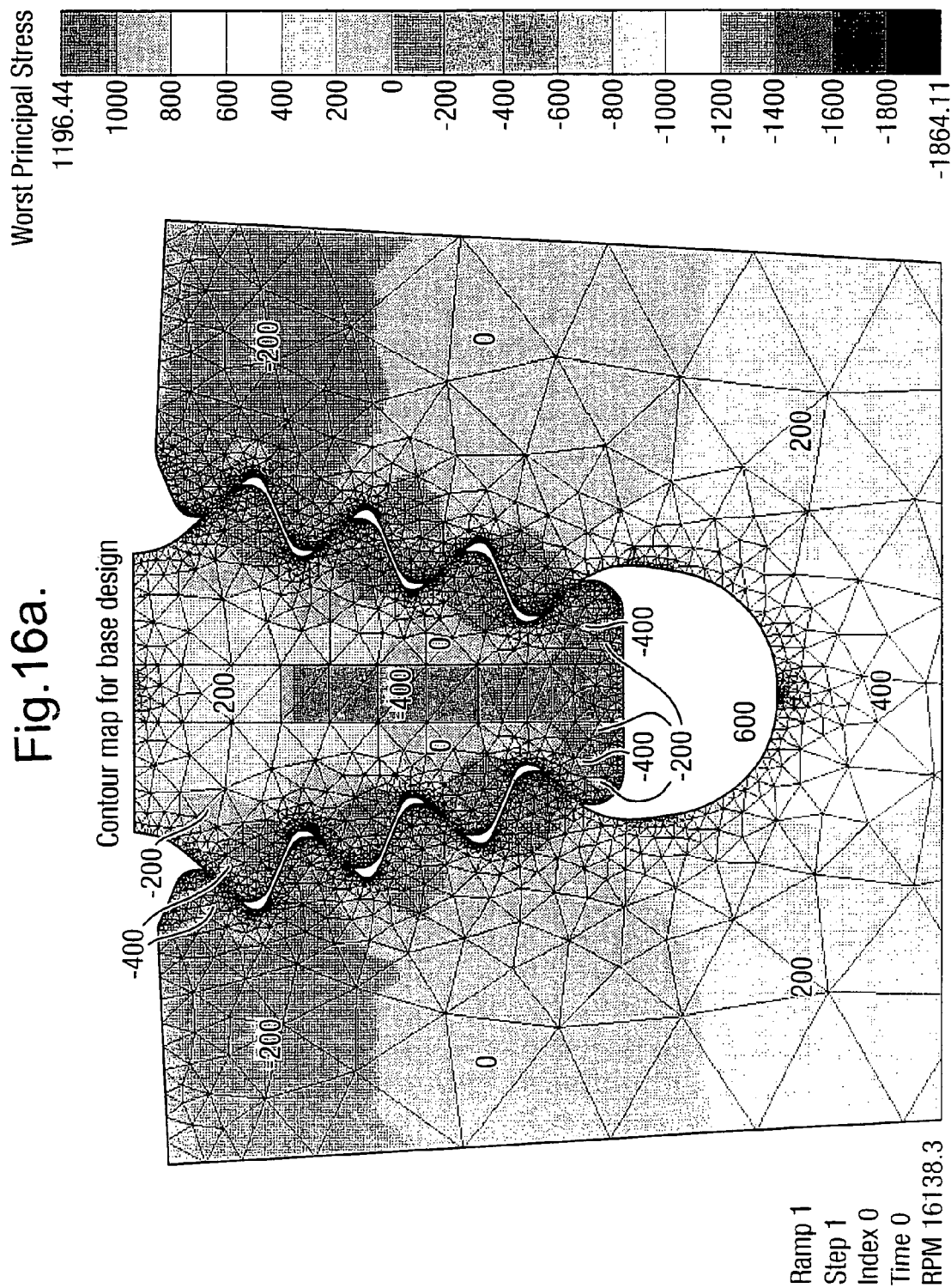
Fig.16a. Contour map for base design

OPTIMISATION OF THE DESIGN OF A COMPONENT

This application is a Continuation of application Ser. No. 10/512,227, filed Oct. 22, 2004, now abandoned which is the US national phase of International Application PCT/GB03/01802, filed in English on 25 Apr. 2003, which designated the US. PCT/GB03/01802 claims priority to GB application Ser. No. 0209543.8 filed 26 Apr. 2002. The entire contents of these applications are incorporated herein by reference.

This invention relates to a method of optimising the design of a component. In particular, although not exclusively, the invention is concerned with the automation and optimisation of the design of a component such as a turbine blade fir-tree root by use of a knowledge based intelligent computer-aided design system and finite element analysis.

In component design a number of different shapes (design variants) of a component are often considered before one is chosen, which meets required design criteria such as performance and reliability targets. Each variant is assessed against the design criteria by the development and execution of one or more computer analysis models, for example a computational fluid dynamics model and/or a thermo-mechanical finite element analysis model. A single CAD representation of the geometry forms the basis of each analysis model. Parametric CAD enables this geometry to be automatically updated when the value of a dimension of a design feature, e.g. a fillet radius, is changed.

The analysis model is generated automatically from data representing the CAD geometry. Boundary conditions defining a number of different load cases are applied to the analysis model to simulate the behaviour of the component over the whole of, or at the limits of, its operating environment.

Shape optimisation is a process which effectively automates the search for the optimal design by linking the automated design loop to an optimisation algorithm. The design process is limited by the restriction imposed by a single original geometric shape. Often a number of different geometric configurations need to be assessed to determine whether a design meets all the required design criteria. For example, it is sometimes not sufficient to assess only a basic design. It may be necessary also to simulate the performance of a wholly or partially failed component, of a damaged component, or of a component falling at the design tolerance limits. Also, to speed up the design process, it may be desirable to assess a simplified version of the component to reduce the time taken for computational analysis.

Thus, in more detail, the design process often requires the analysis of a number of different component topologies, based upon a principal design variant, to assess whether the design is acceptable. Potential topology changes include the superposition of a damage model, based on potential foreign object damage or erosion, or the assessment of an assembly after the primary failure of a component in the assembly. Each of these topologies may be related to the principal design variant by simple mathematical relationships. Examples in the field of gas turbine engines include the assessment of the reliability and performance of a given blade design following a typical birdstrike event, and modelling the loss of a blade from a turbine disk to ensure that the primary failure does not lead to the progressive loss of the remaining blades.

In a component design definition, each dimension is allocated a manufacturing tolerance which reflects the criticality of the particular dimension and the controllability of the manufacturing process upon which it is based. A model of the 'worst' component within the tolerance band is necessary to determine whether the design meets all the design criteria, even at the tolerance limits. These dimension changes may be described by functions of the design vectors and the vector of associated manufacturing tolerances. Examples include the assessment of the minimum tolerance geometry against the ultimate strength criteria as a requirement in pressure vessel design.

A number of analysis models are necessary to analyse the behaviour of a given component. These encompass models which reflect different aspects of the physics or different levels of fidelity to minimise the associated computational cost. Potential geometries include the removal of geometric features e.g. extraction of the aerofoil only, from a model of the aerofoil and attachment, to form the basis of a computational fluid dynamics model; simplification of the geometry e.g. the removal of fillets; and the extraction of a 2-dimensional component section from a 3-dimensional model to form the basis of a 2-dimensional thermal analysis model.

Automating the step of creating different analysis models from a first design geometry would enable the user to execute the process with minimal user intervention and provides the opportunity to link the process to an optimisation algorithm.

In known techniques, the user selects a design from a set of possible design configurations, each generated by an optimisation study considering a single topology and hence a respective subset of the design criteria.

Where a sequence of variable fidelity models is required, for example the evaluation of a 2D model of a component assembly to determine the temperatures for subsequent application to a 3D component model, known techniques make the assumption that the effect of geometry change on the loads is small and hence can be ignored during the optimisation of the 3D component model. On completion of the optimisation process this assumption must be validated and further optimisation studies performed where this assumption is found to be invalid.

According to a first aspect of the present invention there is provided a method of optimising the design of a component, in which method a set of principal design variants is generated, the principal design variants having design parameters which are common to all principal design variants of the set and having design variables which differ between the principal design variants of the set, the method further comprising generating at least one secondary design variant by modifying at least one of the design parameters or the design variants of the at least one principal design variant.

This may be undertaken using a computer executed rule based geometry engine.

Analysis models representing the principal and secondary design variants may be generated, and input conditions may then be applied to the analysis models to determine the behaviour of the design variants.

The generation of the principal design variants preferably comprises an iterative process responsive to output data from the analysis models.

Each second design variant may be derived from the principal design variant by applying a mathematical operation to at least one parameter and variable of the respective principal design variant.

The secondary design variant, or one of the secondary design variants, may represent a component made to the design at a tolerance limit, a component failure, or damage to a component made to the design.

According to a second aspect of the present invention there is provided a method of manufacturing a component, the method comprising:

(a) optimising the design of the component by a method in accordance with the first aspect of the present invention; and (b) manufacturing the component in accordance with the optimised design.

The component may be a component of a gas turbine engine, and may be a turbine blade having a fir tree root, the design of at least the fir tree root being optimised in accordance with the first aspect of the present invention.

In accordance with the present invention there is also provided a computer program product comprising code for carrying out a method according to the first aspect of the present invention. Additionally there is further provided a computer system adapted to carry out a method according to the first aspect of the present invention.

Thus the present invention provides a novel step within the shape optimisation process, in which a single set of design dimension is used to generate a plurality of geometries by utilising a rule-based geometry engine. These geometries form the basis of a set of analysis models which enable all the design criteria to be assessed within a single design iteration. Possible geometry changes include topology change, dimension change, feature reduction and dimension reduction (ie 3-D to 2-D). The intelligent CAD system (ICAD®) from Knowledge Technologies International is one example of a commercial off-the-shelf rule-based geometry engine, that can be employed in a method in accordance with the present invention.

A component geometry is described in a CAD system by a number of geometric features, e.g. lines, arcs, NURBS etc. whose relationships and dimensions are prescribed by the designer. In shape optimisation these dimensions are split into two categories: design parameters $p=(Pi)$ $i=1,m$ whose values are held fixed and design variables $x=(Xk)$ $k=1,n$ whose values are varied by the optimiser to achieve design improvement. In conventional techniques, each optimisation iteration generates a single geometry (or principal design variant) based upon the vectors p and x.

In a method in accordance with the present invention, a new step is introduced in the shape optimisation process, which enables a number of different geometries, or secondary design variants, to be generated based upon the design vectors p and x. The step utilises a rule-based geometry engine to define a number of secondary design variants, each related to the principal design variant by simple mathematical functions of p and x.

Introducing this geometry creation step enables a plurality of geometries to be generated based upon the single design variable vectors p and x. These geometric configurations can be used to form the basis of the set of computational models necessary to perform an assessment of all the design criteria within a single original design iteration.

For a better understanding of the present invention and to show how it may be carried into effect, reference will now be made by way of example to the accompanying drawings, in which:

FIG. 2 is an example of a fir tree joint and the associated geometry blade and disc geometry (both partially shown);

FIG. 3 is a table of quantities used to describe the geometry of a fir-tree root component;

FIG. 6 is a table of design parameters of a fir tree root and tooth used in the optimisation process of a fir tree joint component;

FIG. 7 is a table of design constraints used in the optimisation of a fir tree joint component;

FIG. 8 is a table of geometric and mechanical constraints and normalised values;

FIG. 14 is a table illustrating which stress distributions are affected by various design variables;

FIG. 15 is a comparison between the original geometry and the optimal geometry resulting from the genetic algorithm search results; and FIGS. 16a and 16b are FE stress diagrams for two profiles after being optimized towards different goals.

The product design process normally begins with the definition of requirements based on customer demands and goes from the conceptual design stage to the detailed design stage. Once the design specification is determined, the conceptual design stage starts with the implementation of the design in a computer environment followed by analysis to explore the feasibilities of candidates.

Figure 1:
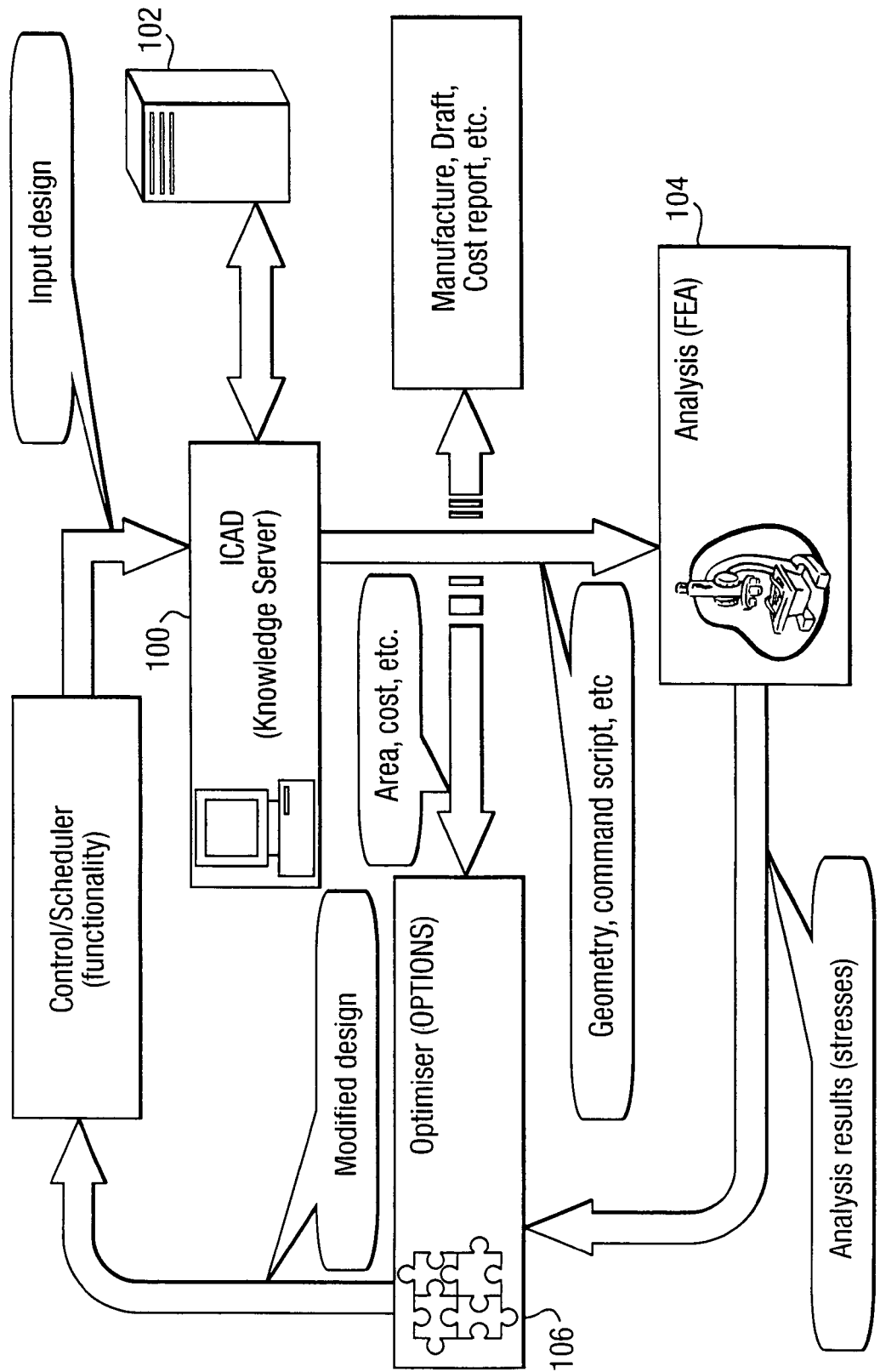
FIG. 1 is a general block diagram of an optimisation process.

The overall architecture of the design optimisation process is illustrated in FIG. 1. In this structure, an ICAD (Intelligent Computer Aided Design) knowledge server 100 is used to generate the model definition based on rules that may be stored in a knowledge database 102. The model is defined in a descriptive form using the ICAD design language, which is a derivation of, and extension to Common LISP, designed for geometric modelling. This model is used to produce geometry and related information. The geometry is then passed to the analysis code 104 along with any geometry dependent properties to evaluate the design performance.

Analysis plays an important role in investigating various design alternatives to determine the best design. It is, however, very difficult for traditional CAD systems to capture design intent and to describe the functional relationships between thousands of entities in a complex product model. What is produced by this known kind of CAD system is the final results of design, not the modelling and analysis process, which is often documented separately. Whenever the designer would like to review the design or rebuild the modelling process with even minor modifications this usually takes a long time. This kind of knowledge is documented or retained as the experience of the designers which is difficult to utilize during subsequent iterations by other designers. Expert system and knowledge-based approaches have made some progress in this regard. The Intelligent CAD system (ICAD) from Knowledge Technologies International is a combination of knowledge-based engineering and CAD technology and its generative modelling capability can be used to provide flexible and robust geometry for subsequent analysis.

ICAD is a knowledge-based computer-aided design tool. Although geometry is the main object of manipulation, the most interesting feature is that it can be used to capture a corporate knowledge base along with best practice and performance, manufacturing and cost criteria into a complete product model, known as a "generative model". The difference between using knowledge-based engineering (KBE) tools and using conventional CAD lies in the following aspects: KBE is knowledge oriented, while CAD is geometry oriented; CAD works from the bottom up with detailed dimensions while KBE works on conceptual level and can harness all the design specifications including physical laws, material criteria, manufacturing constraints, and even non-technical aspects. KBE uses rule-based model generation methods in conjunction with a CAD modelling engine supporting solid modelling techniques.

The rules which are used to describe the geometric relationships can be expressed in various forms, such as equalities or inequalities using mathematical and logical relationships. It can further make some decisions about design on the basis of the rules supplied to it. This will give the model some kind of intelligence. It should be noted that there are other CAD/CAE tools such as Pro/Engineer, which also offer feature-based parametric solid modelling capabilities. Moreover, most CAD/CAE tools also provide their own 'macro' languages that form the basis for extension of their functionality. The choice of ICAD in this study is based on the flexibility offered by incorporating the LISP language into the IDL (ICAD Design Language) that is used in model construction.

Analysis based optimisation has been identified as being able to play a significant part in the process of producing high quality designs against known constraints. However the embedding of optimisation in the design process requires the parameterisation of the design and automatic updating of the model used in the analyses. ICAD can be used to implement this capability because of its object-oriented, descriptive geometry modelling approach. This allows engineers to quickly and accurately explore and test multiple design configurations against all known constraints. This makes it possible to optimise the design in a reduced time scale.

Here, the design of the fir-tree geometry is carried out using ICAD. The basic procedure of the geometry design falls into two steps: first identification of the features and rules used to define the geometry and secondly the breaking down of the whole model into several modules, each of which becomes a building block in a hierarchical structure. In ICAD, each of these basic blocks is described using the ICAD design language (IDL) as a generic definition which can be implemented in the ICAD browser using a specific set of parameter values. Thus the model is defined parametrically: different sets of parameter values will result in different designs from the same template. In addition, multi-modality and backward compatibility can be achieved by incorporating different behaviours into one model with a single interface while only the internal implementation is modified.

A single basic tooth geometry 50 is illustrated in FIG. 2, which is defined in such a way as to allow the designer to explicitly control the non-contact clearance 52 and to avoid duplicate entities in the model. This latter feature eases the application of boundary conditions and loads during analysis.

The acceptability of any fir-tree geometry needs to be checked since some particular combination of parameters may result in unacceptable features such as intersections between entities or the collapse of very short entities. The handling of unacceptable features is important to the optimisation process as well as to the analysis code. Using ICAD, geometry features can be checked within the modelling process, as part of the whole model and appropriate actions can then be taken using preset default values, while signalling which parameter is causing the problem. Taking the modelling of the base tooth 50 as an example, in every step the modelling process is checked to make sure an acceptable geometry can be produced, otherwise, a geometry failure is signalled to the optimiser 106 to cancel the analysis. An example of unacceptable base tooth geometry, in which two circular arcs 54, 56 are intersected, is also illustrated in FIG. 2. In this condition, the radius RE has been increased to a value which results in the profile failing to meet the end point 53 of the section shown.

Here, the blade root 58 and disk head 60 geometry are defined in the same way as the basic tooth, with further parameters and rules being needed. Details are covered in the following sections. Some of the quantities used in the definition are not expected to change and are thus held constant during an optimisation run and are referred to as design parameters, while others which are identified as being more influential to the design will be varied by the optimiser in the optimisation loop and are referred to as design variables.

Figure 4A:
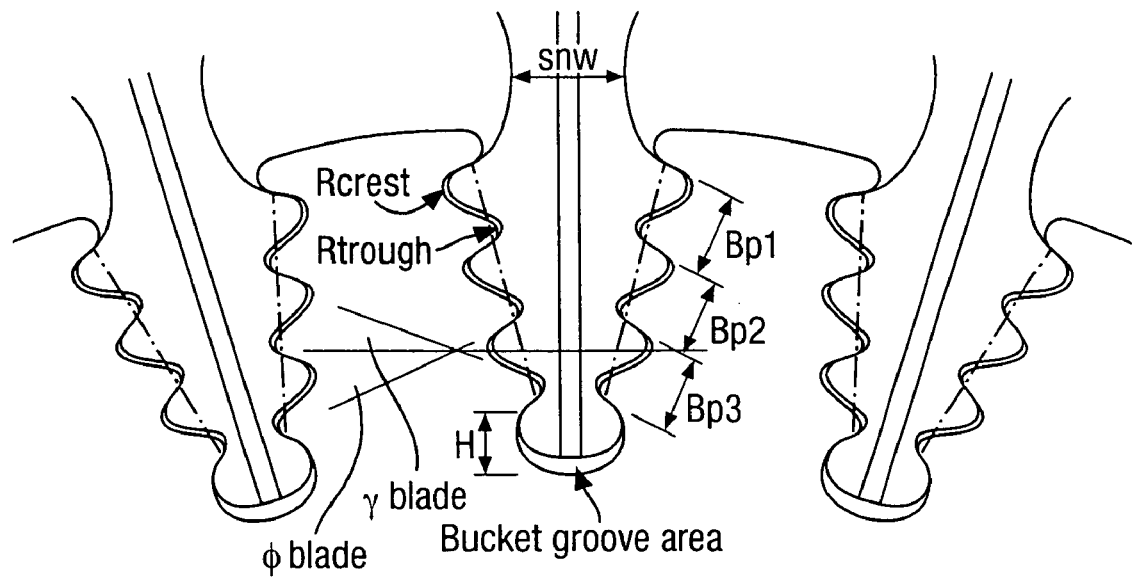
FIG. 4a is a simplified cross section of a fir-tree root component with blade root geometry.
Figure 4B:
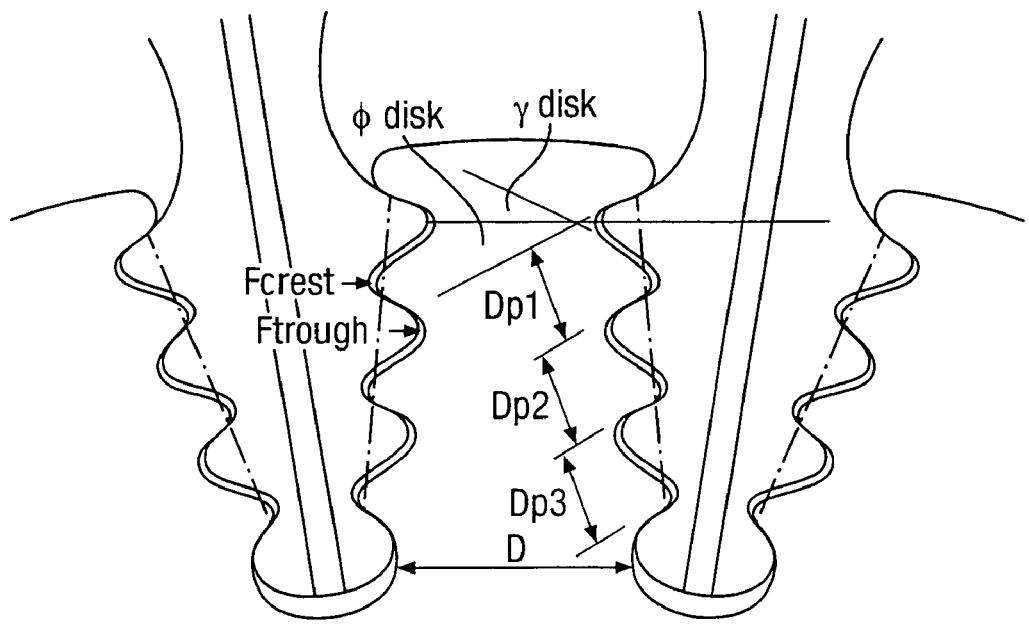
FIG. 4b is a simplified cross section of a fir-tree root component with disk head geometry.

The first fir-tree geometry 50 shown is a simplified version of an existing fir-tree model, which is composed of straight lines and circular arcs only. The complete geometry is described by approximately 30 quantities, as shown in FIG. 3. The resultant blade/disk geometry is illustrated in FIGS. 4a and 4b. Some of these quantities are design variables and are identified as playing an important role in the stress distribution and thus will be optimised against known constraints. Others are design parameters which will be kept at constant values based on previous experience.

Every entity within the ICAD model can have additional non-geometric properties which will ease the use of the geometry in other applications such as analysis and manufacture. This object-oriented feature enables various information related to a product design to be integrated into a single model. For example, to apply boundary conditions and loads to entities during the analysis stage, it is desirable to name the entities with unique tag names which can then be referenced later. Using tag names on each entity in the geometry enables the boundary conditions, load properties and mesh parameters to be specified in batch mode.

Geometric quantities such as the minimum thickness of the blade root, the distance between the centre of the contact face of the tooth on each side, etc., are calculated in the ICAD model based on a mathematical representation of the geometry. Some of these are treated as constraints in the optimisation problem and some are used to generate the FE model or to retrieve analysis results. For example, point coordinates are normally required to get the stress values at those points.

The fir-tree joint used to hold a blade in place in a turbine structure is usually identified as a critical component which is subject to high mechanical loads. Most often the attachment is a multi-lobe construction used to transfer loads from blade to disk. It is generally assumed that there are two forms of loading which act on the blade, the primary radial centrifugal tensile load resulting from the rotation of the disk, and bending of the blade as a cantilever which is produced by the action of the gas pressure on the airfoil and forces due to tilting of the airfoil. The resulting stress distribution in the root attachment area is a function of geometry, material and loading conditions (which are of course related to the speed of rotation). It is known that some critical geometry features exist for the stress distribution in the blade disk interface.

Many studies into the stress state of the blade root attachment have been reported, originally using photo-elastic methods, now mainly using finite element analysis. Modern finite element codes already have the capability of dealing with thermal-mechanical coupling and contact analysis between blade root and disk head. It is now relatively easy to obtain the stress distribution in the attachment area using commercial FE codes. Also many in-house FE codes exist to handle corporate-specific problems (these have some advantages over commercial tools among which the most notable is complete control over the source code). Although there are many kinds of code available, the general procedure of finite element analysis is almost always as follows:

(1) Create the geometry, or import the geometry from another CAD system;

(2) Apply the boundary conditions and loads;

(3) Mesh the geometry;

(4) Solve the problem and retrieve the results.

Most FE codes support batch running of the analysis and this allows the analysis to be embedded into the overall optimisation loop. Smooth coupling of the modelling process and analysis, however, is not an easy task. It involves the transfer of the geometry itself and related geometry dependent properties to the analysis code, in this case, the finite element software 104. Using unique tag names for each entity allows the correct geometry dependent properties to be associated with the respective geometric entity, even if the number of entities is changed or a value of an entity changes.

The loading on the root is mainly due to centrifugal load which is dependent on the mass of the whole blade. The design of the fir-tree root involves an iterative process of controlling the blade mass, which incorporates the root mass. Also some key features, such as the fillet radius, play very important roles in the stress distribution in notch regions. Thus a set of competitive constraints ranging from geometrical, mechanical, cooling requirements, etc., is established for use in exploration of various design candidates for the fir-tree root. Finite element analysis is then utilized to obtain the resulting stress distributions. This further complicates the situation. A traditional manual method is now too slow for this process and thus automation is required. Four types of constraints are used to check the design:

Crushing stress describes the direct tensile stress on the teeth: bedding width is the main factor affecting the stress.

Unzipping can occur after a blade release: the disk post on either side of the released blade are then subject to high tensile and bending stresses. The disk post must be able to withstand these stresses in order to avoid a progressive 'unzipping and release' of all the blades Disk neck creep: the disk posts are subject to direct tensile stress which causes material creep. Too much creep, combined with low cycle fatigue, can dramatically reduce the component life.

Peak stresses: peak stresses occur at the inner fillet radii of both the blade and the disk. If the fillet radii are too small and produce unacceptable peak stresses, some bedding width has to be sacrificed to make them bigger.

Apart from the above constraints, which are used to check the candidate designs, some others are used to check the optimised result. These include vibration limits, neck stress, etc. From a preliminary blade number optimisation, these criteria are not deemed a significant constraint here.

As the fir-tree geometry is constant along the root centre line, it is possible to think of the stresses as two dimensional. However, the loading applied along the root centre line is not uniform, so strictly speaking, the distribution of stresses will be three dimensional. Nonetheless, it is still possible to assume that each section behaves essentially as a two dimensional problem with different loadings applied to it. The difference of loading on each section is affected by the existence of skew angle which will increase the peak stresses in the obtuse corners of the blade root and the acute corners of the disk head. From previous root analysis research, it is feasible and convenient to use a factor to estimate the peak stresses at each notch of the blade and disk, and this factor takes different values for different teeth.

Also, it is known from previous work using photo-elastic and finite element methods, that the distribution of centrifugal load between the teeth is very non-uniform and the top tooth may take a significant portion of the load. This feature allows the possibility of using different tooth sizes. The system implemented here also allows designers to explore the effect of varying the number of teeth, but this may cause difficulties when gradient-based methods are used for optimisation.

Figure 5A:
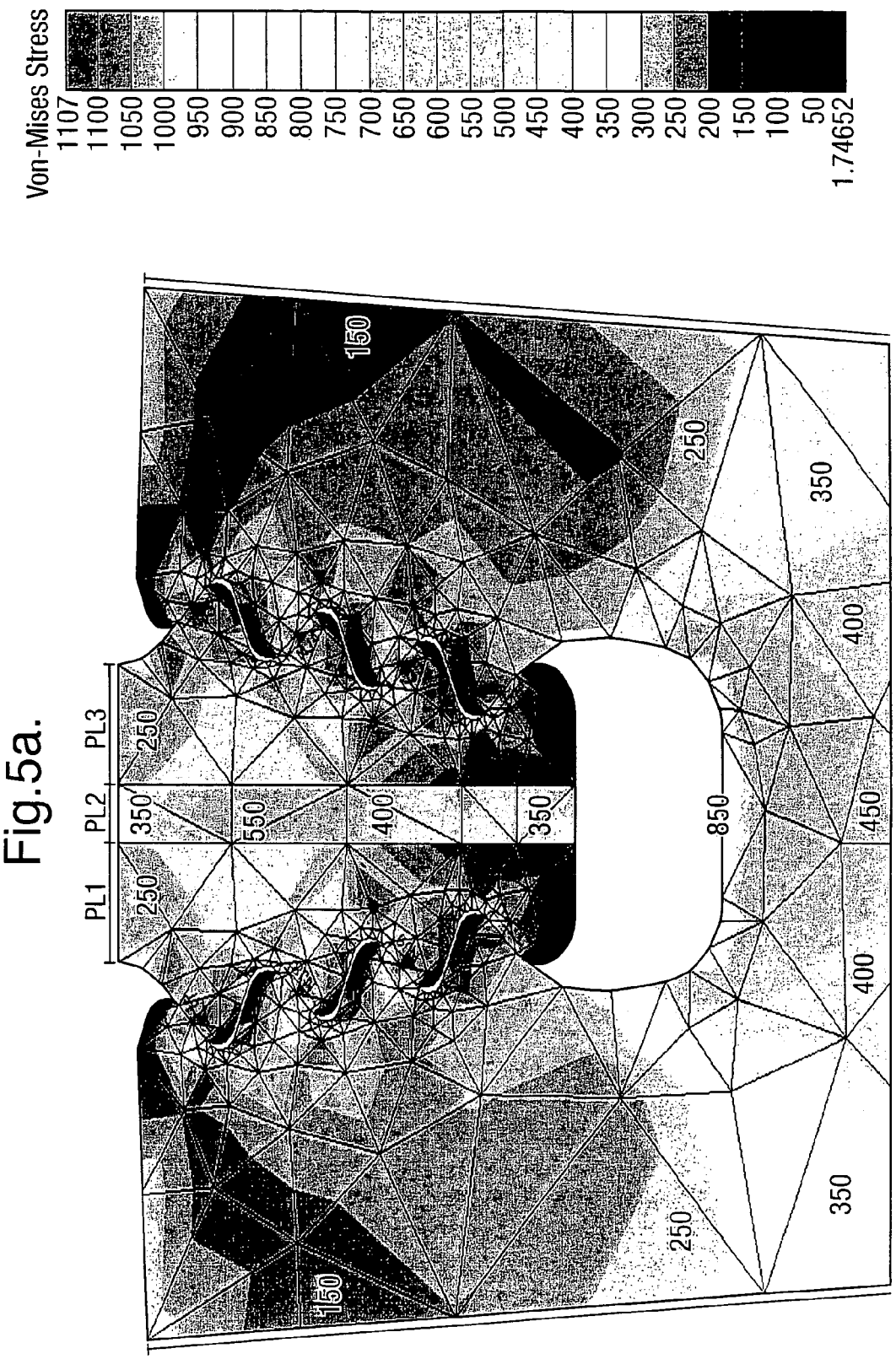
FIG. 5a is a FE stress diagram for a single blade installed in the disk.
Figure 5B:
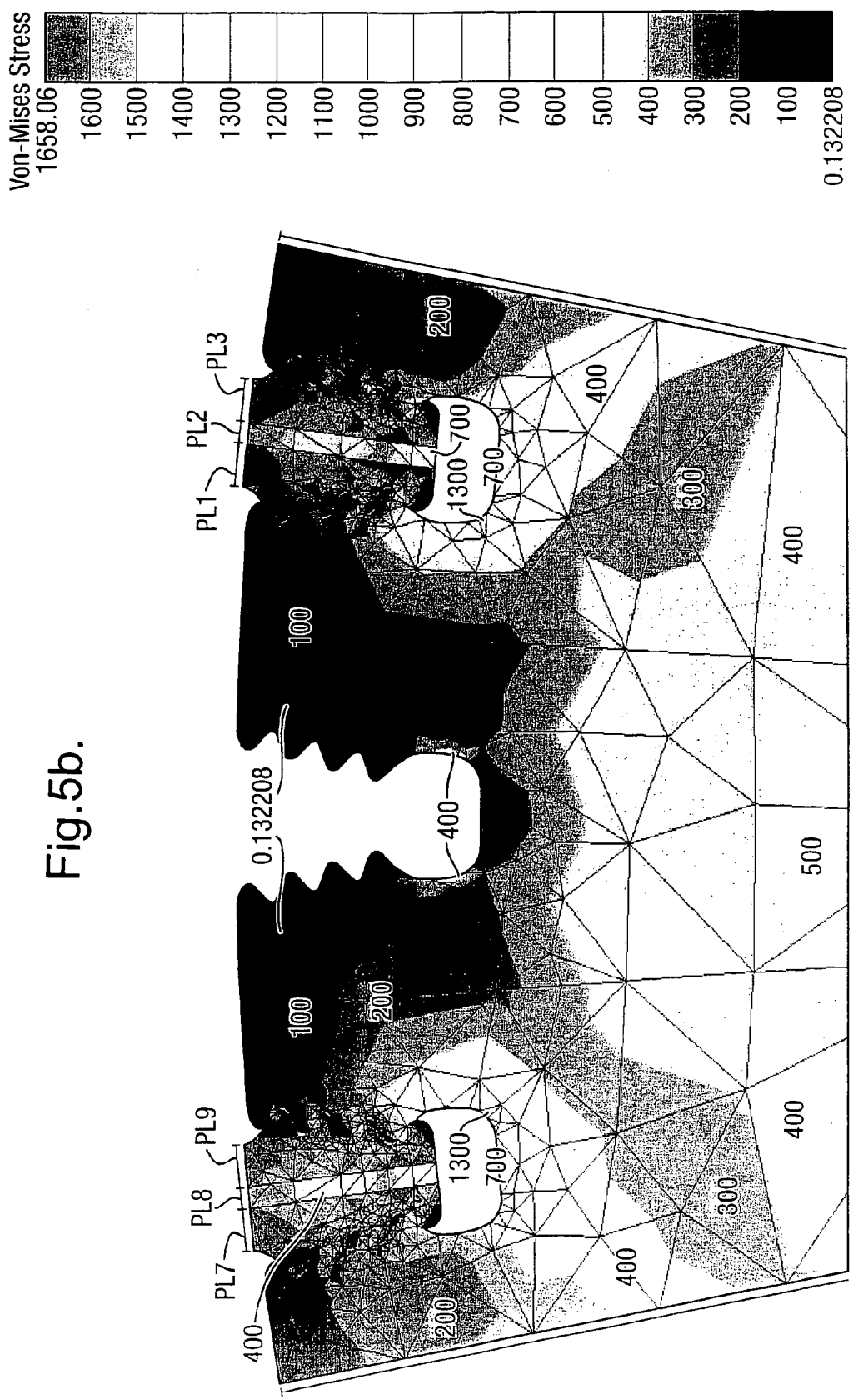
FIG. 5b is a FE stress diagram for three blade sections of a disk with the middle blade removed.

Both a one sector model and a three sector model are considered when estimating the mechanical constraints, the one sector model for the estimation of maximum notch point stresses, crushing stresses and blade/disk neck mean stresses and the three sector model for the estimation of unzipping stresses. Typical FE results are illustrated in FIG. 5a and FIG. 5b, for the one sector model and three sector model, respectively. In general, finite element analysis is computationally expensive, thus a compromise between accuracy and computation cost should always be made to obtain acceptable results as quickly as possible when this is embedded in an optimisation run. This compromise is made by an appropriate choice of mesh density.

It will be appreciated that the condition shown in FIG. 5b represents a secondary design variant, in which one blade is entirely missing from the analysis model. This enables an evaluation to be made, during the optimisation process, of an altered geometry created by a rule-based process.

The whole process from the importing of geometry, application of boundary conditions and loading, to results retrieval is implemented here as a SC03 Plugin, which is a facility provided by the Rolls-Royce in-house FEA code SC03 to extend the capability of its core functionality. A command file is used by SC03 to carry out jobs ranging from importing geometry from IGES files, applying boundary conditions and loads, to retrieving stress results.

Two different optimisation problems were tackled using population based genetic algorithms (GAs) and gradient-based methods. One was to minimize the area outside of the last continuous radius of the turbine disk, which is proportional to the rim load by virtue of the constant axial length. This quantity is referred to as the fir-tree frontal area in the following sections. The number of teeth is treated as a design variable in this problem and the number of constraints is dependent on the number of teeth. The other was to find the optimum tooth profile to minimize the maximum notch stress. The design variables (see FIG. 6) and constraints (see FIG. 7) used in the second problem are a subset of those defined in the first problem (which has 14 design variables and up to 53 constraints for a three-tooth design) although the goals are different.

The constraints are divided into two categories, geometric and mechanical, which are summarized in FIG. 8 along with the normalized values for the initial design. For the meaning of symbols used in this section, please see FIGS. 3, 4a and 4b. The normalization adopted here is described as follows for upper and lower limits u and l, respectively:

a. constraints with upper bounds only:;

b. constraints with lower bounds only:;

c. constraints with both upper and lower bounds:.

These different formula make it possible for all normalized constraints to have consistent behaviour when the design is moving from an infeasible region towards feasibility, and to have the values of −1 or +1 at the boundary of the constraints.

It is necessary to establish the appropriate values for mesh control parameters. The purpose is to find a compromise between the high computational costs that are incurred for very fine meshes and the accuracy required to capture the maximum stresses in the notch area. Therefore, the local and global effects of mesh density must be studied.

Following the set up of the system, a series of systematic evaluations is carried out to establish appropriate mesh density parameter values and to gain experience on the effects of design variables changes. From varying the mesh density control parameters while holding all others constant, for example the global and local edge node spacing, it is found that reducing the notch edge node spacing increases the mesh density and therefore reduces the perturbations in maximum notch stress. In this example the use of 0.001 mm for both global and local edge node spacing has been chosen as a suitable value. The effect of different geometric features on the stress distribution within the structure are summarized in FIG. 14.

From parameter study results it can be seen that the notch stress on the second tooth takes the largest value, as already implied from previous work: this aspect makes it desirable to design each tooth using different values of tooth profile parameters.

Figure 9:
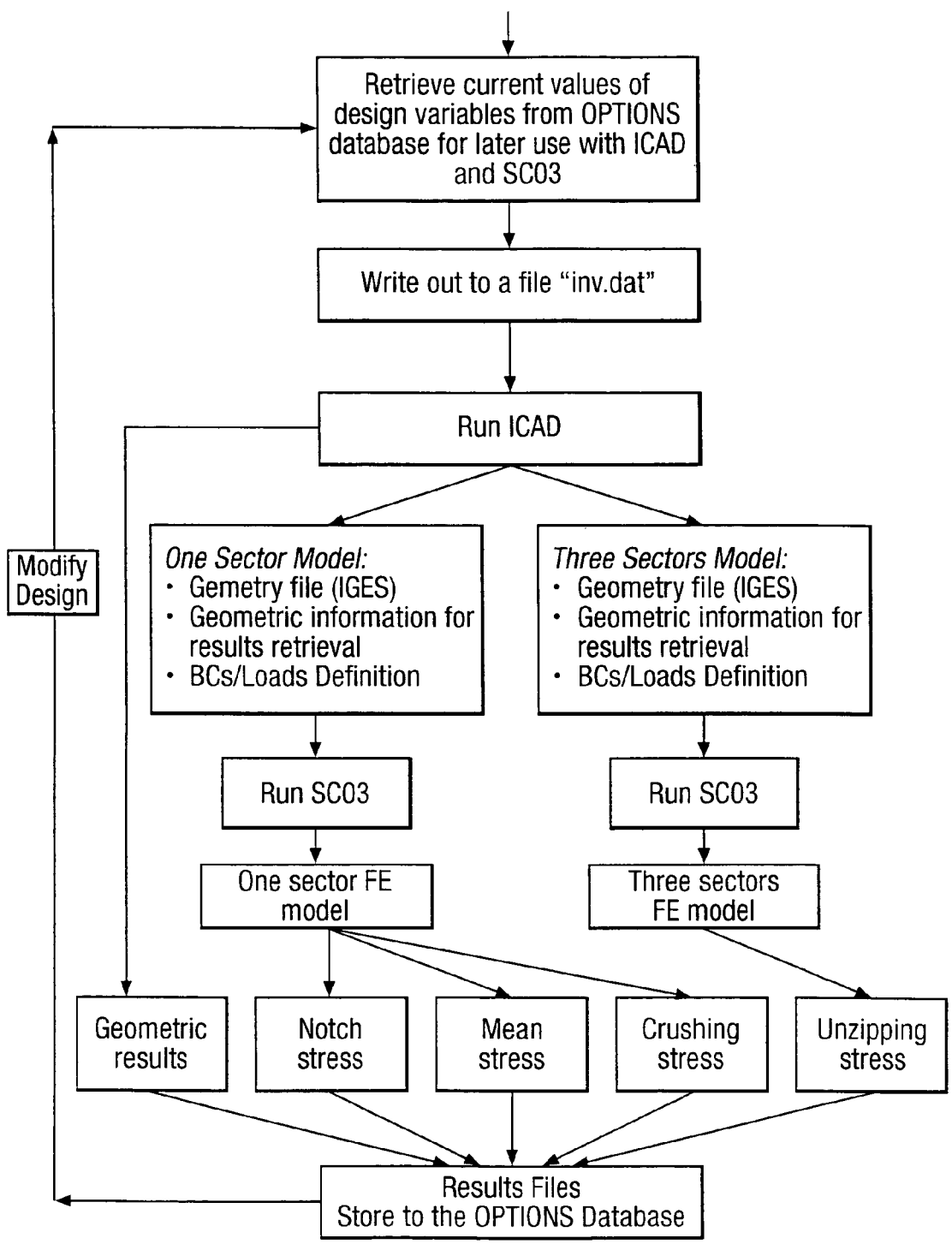
FIG. 9 is a diagram of the optimisation program structure.

With reference to FIG. 9, the optimisation is performed in this preferred embodiment using the OPTIONS software package which provides designers with a flexible structure for incorporating problem specific code as well as more than forty optimisation algorithms. The critical parameters to be optimised, or design variables, are stored in a design database, which also includes the objective, constraints and limits. The design variables are transferred to ICAD by means of a property list file which contains a series of pairs with alternating names and values. This file is updated during the process of optimisation and reflects the current configuration, constituting a principal design variant. The geometry file produced by ICAD is then passed to the FE code SC03 which is executed by a command file. The analysis results are written out to another file, which is read in by the optimisation code. The design variables are then modified according to the optimisation strategy in use until convergence or a specified number of loops has been executed. In this way the optimisation is an iterative process. A design variable is changed, the effect analysed and the process repeated. The program structure is illustrated in FIG. 9.

In the process illustrated in FIG. 9, the "one sector model" constitutes the principal design variant. Using a rule based geometry engine, a secondary design variant is generated at each iteration by applying mathematical operations on the principal design variant. In this example the secondary design variant represents a three sector model with the central blade missing to assess the unzipping criteria. Potential alternative secondary design variants include a damaged component, or a geometry at the design tolerance limits.

Owing to the presence of a discrete design variable (the number of teeth), most gradient based optimisation techniques will not work directly here. Therefore a two-stage strategy of combining a Genetic Algorithm (GA) with gradient search may be used in this problem. A typical GA is first employed in an attempt to give a fairly even coverage on the search space, and then gradient based search methods are applied on promising individuals with the number of teeth fixed. One of the considerations here is that GAs are capable of dealing with discrete design variables. Another consideration is that as the GA proceeds, the population tends to saturate with designs close to all the likely optima including sub-optimal and globally optimum designs, while gradient based methods are more suited to locating the exact position of individual optimum given suitable starting points. Here the GA is used to give good starting points for the gradient search methods.

In this example an initial analysis on the base design reveals that several geometric and mechanical constraints are violated. These include geometric constraints 4, 9, 10 and 11 (see FIG. 7), and the disk notch stress constraints. FIG. 8 shows the resulting normalized constraint values for the base design. Note that this means that the GA must first locate feasible designs before it can begin optimization.

Genetic algorithms often require large number of evaluations of the objective function and constraints. The computational cost involved can soon become prohibitively high when computationally intensive finite element analysis is used to calculate the stresses in the structure. In this problem each evaluation takes about 5-6 minutes to finish, and most of this time is engaged in finite element analysis. This means that it takes about 80 hours to finish a 10 generation GA search with a population size of 100 using serial processing. (Note that for some specific sets of parameters, there is no viable geometry that can be constructed, and when this occurs SC03 is simply signalled to cancel the analysis).

Because of the large number of design variables, the optimisation trace may only be plotted on contour maps of two variables if these maps are produced while holding all the other variables constant. Furthermore, if only a small number of quantities are chosen as design variables, there may be no feasible designs at all. For an infeasible starting design, it is easier for the optimiser to find a feasible region if a large number of quantities are left as design variables and broad exploratory searches are used.

Figure 10:
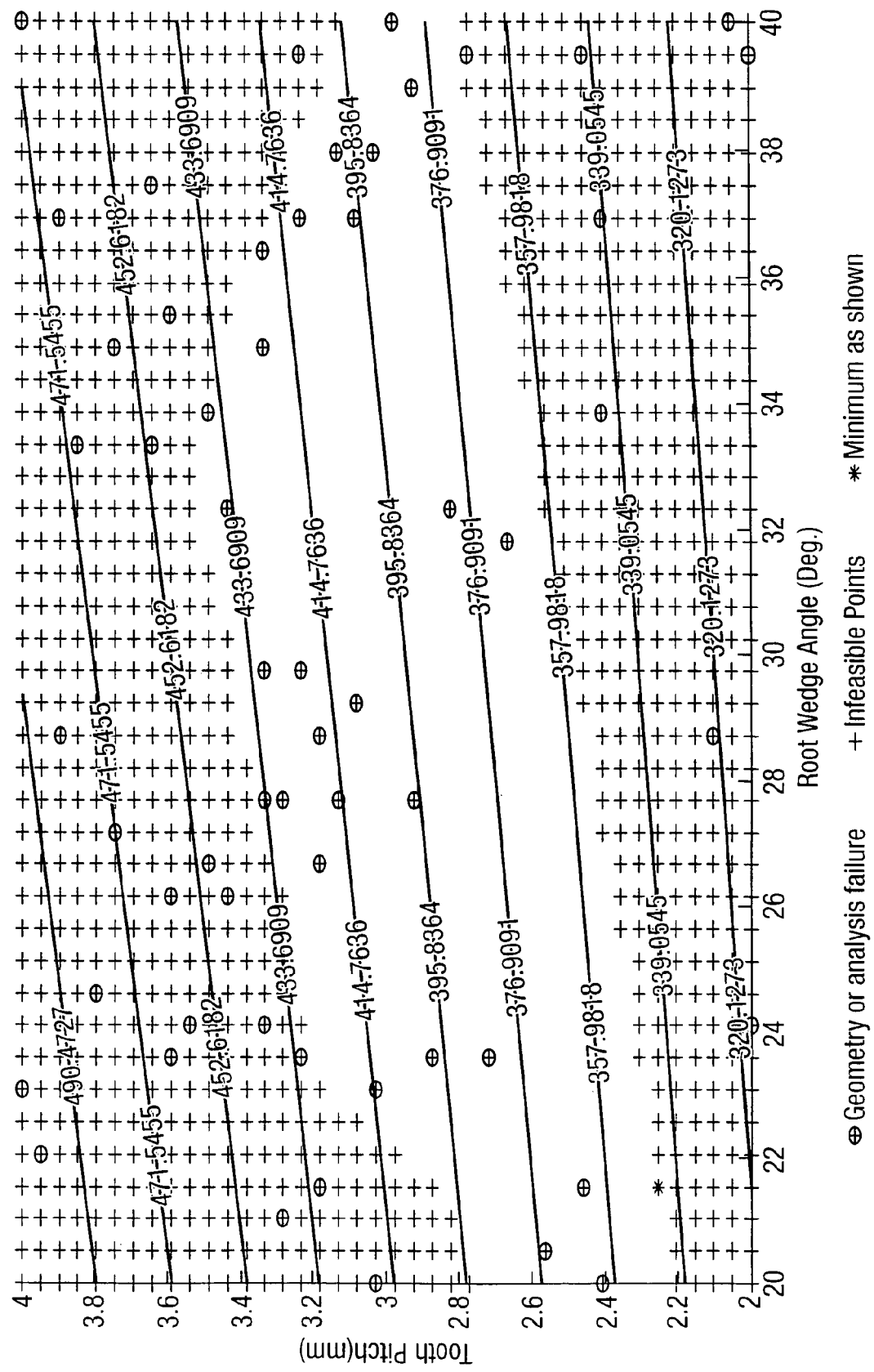
FIG. 10 is a contour map of fir tree frontal area for root-wedge-angle and tooth-pitch based on Genetic Algorithm results.

A contour map for two design variables has been generated using results from the GA search (FIG. 10). Infeasible geometries and possible analysis failures are also illustrated in the Figure. It is noted that identification of this type of failure is useful for identifying any problems with the implementation of the system (sometimes calculations fail simply because of delays due to overloading of the network), but this is not a concern for optimisation as long as appropriate measures are employed to avoid misleading the optimiser. This is important especially when approximations such as response surfaces are introduced to improve run speeds.

Figure 11:
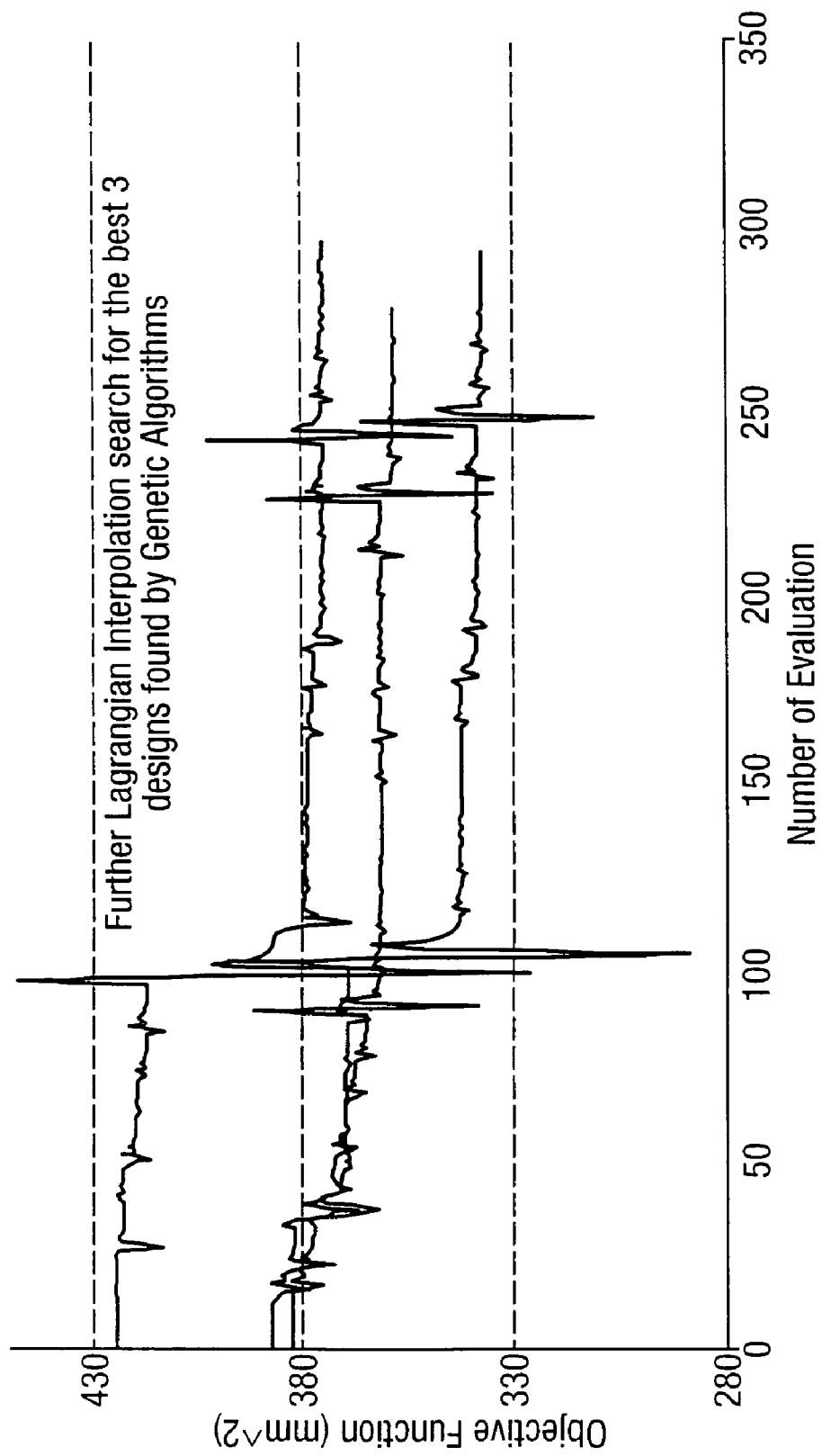
FIG. 11 is a graph of results obtained from a gradient based search for use in the optimisation process.
Figure 12:
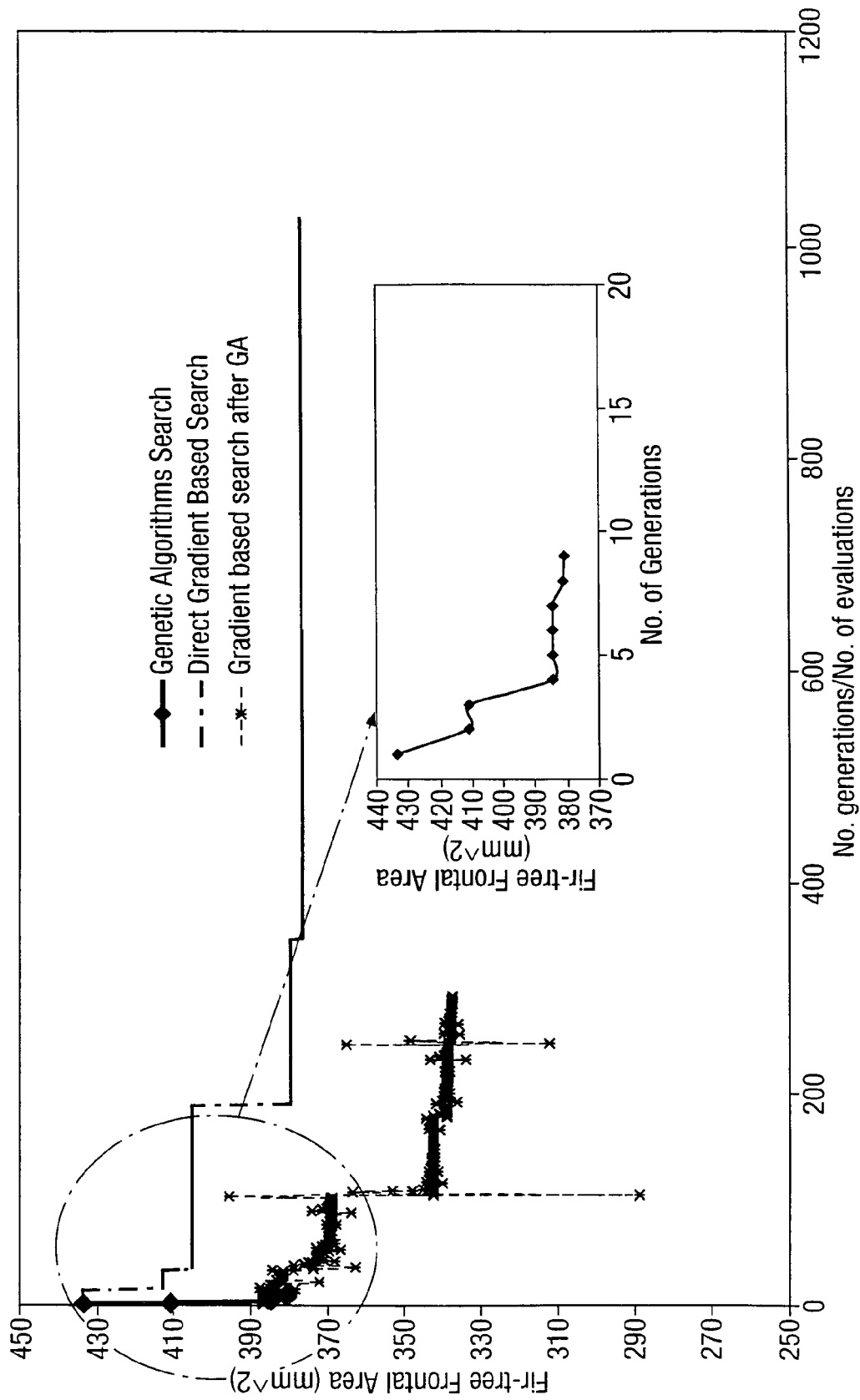
FIG. 12 is a graph of results obtained from a direct gradient based search for use in the optimisation process.

A gradient based search is illustrated in FIG. 11. It can be seen that better starting points do not always converge to better results, depending on the location in the design space. This justifies the use of the whole final population of the GA results instead of just the best one as starting points for gradient search. A comparison between this simple two-stage strategy and a direct gradient-based search is provided in FIG. 12, which shows that this two-stage strategy, although simple, works better than a direct gradient search as the initial GA search offers a better chance of steering the optimiser towards global optima, while a direct gradient-based search will more likely get stuck in a local optimum.

Figure 13:
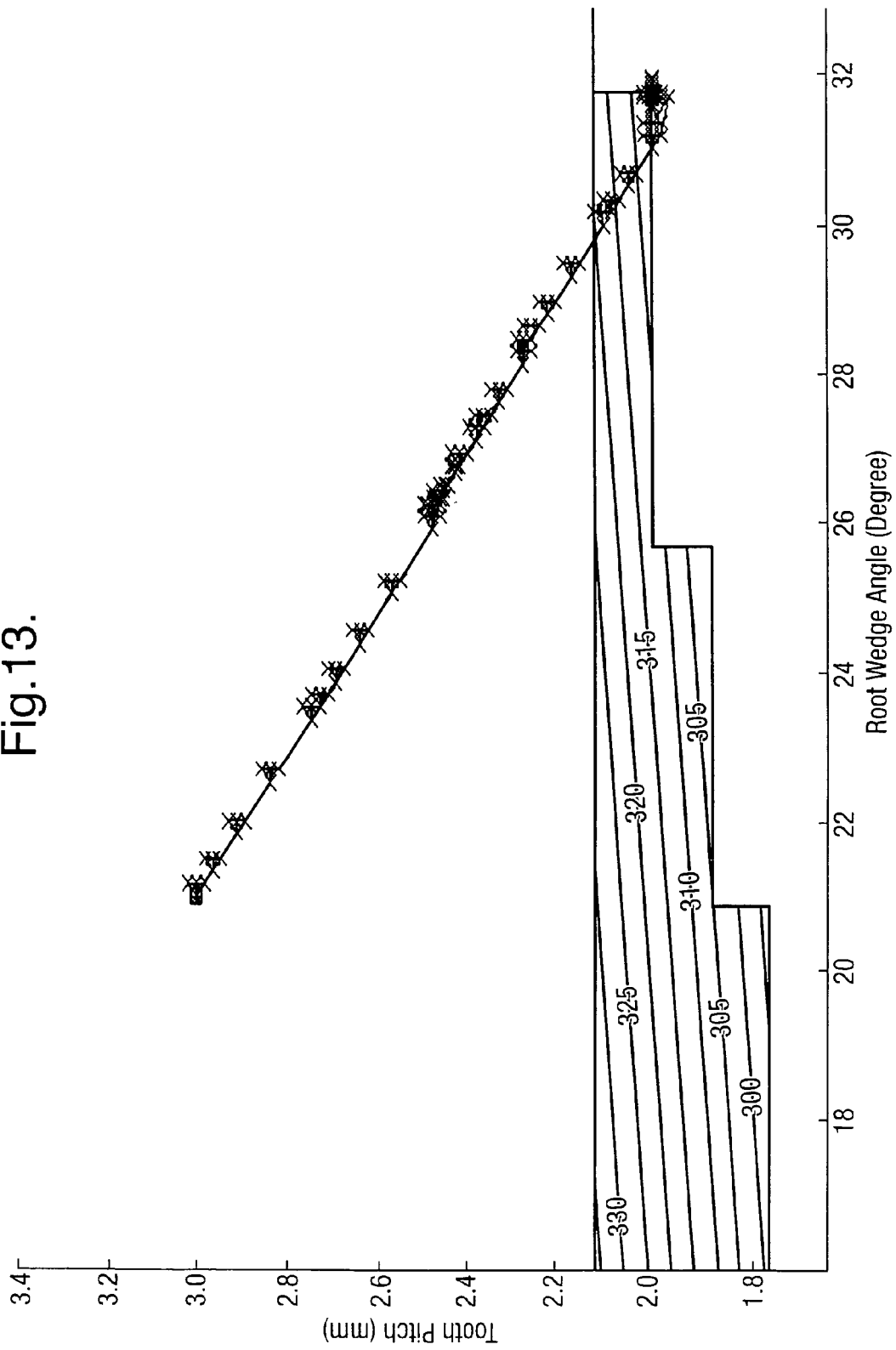
FIG. 13 is a graph of results obtained from the Hooke and Jeeves gradient based search for use in the optimisation process.

Several steepest descent search methods have been applied to the problem after the initial GA search: these include the Hooke and Jeeves direct search method plus various other methods discussed in Schwefel's book. The first method is very fast when the number of design variables is small, as shown in FIG. 13, in which only 6 variables are chosen as design variables (the full scale problem contains 14 design variables). Although the complexity of this problem is only modest, the computational cost in terms of the thousands of evaluations required for some search techniques is still an obstacle for a detailed search. It can be seen from the contour maps that the objective function is rather smooth, and this may justify the use of approximation techniques alongside the accurate finite element model.

A 20% reduction in the objective function is achieved in this example using the above methods while satisfying all the geometric and mechanical constraints. By looking at the trace data of the search process, it can be seen that the three geometric constraints and the disk notch stresses (identified earlier) remain the major factors affecting the optimisation results. Note that the primary changes to geometry occurred during the GA search and are as illustrated in FIG. 15, where the base geometry shown at 70 and the optimised geometry at 72. These are a decrease in tooth pitch, an increase in shank neck width and a decrease in three of the four fillet radii. In addition, the root wedge angle is slightly increased.

Figure 16B:
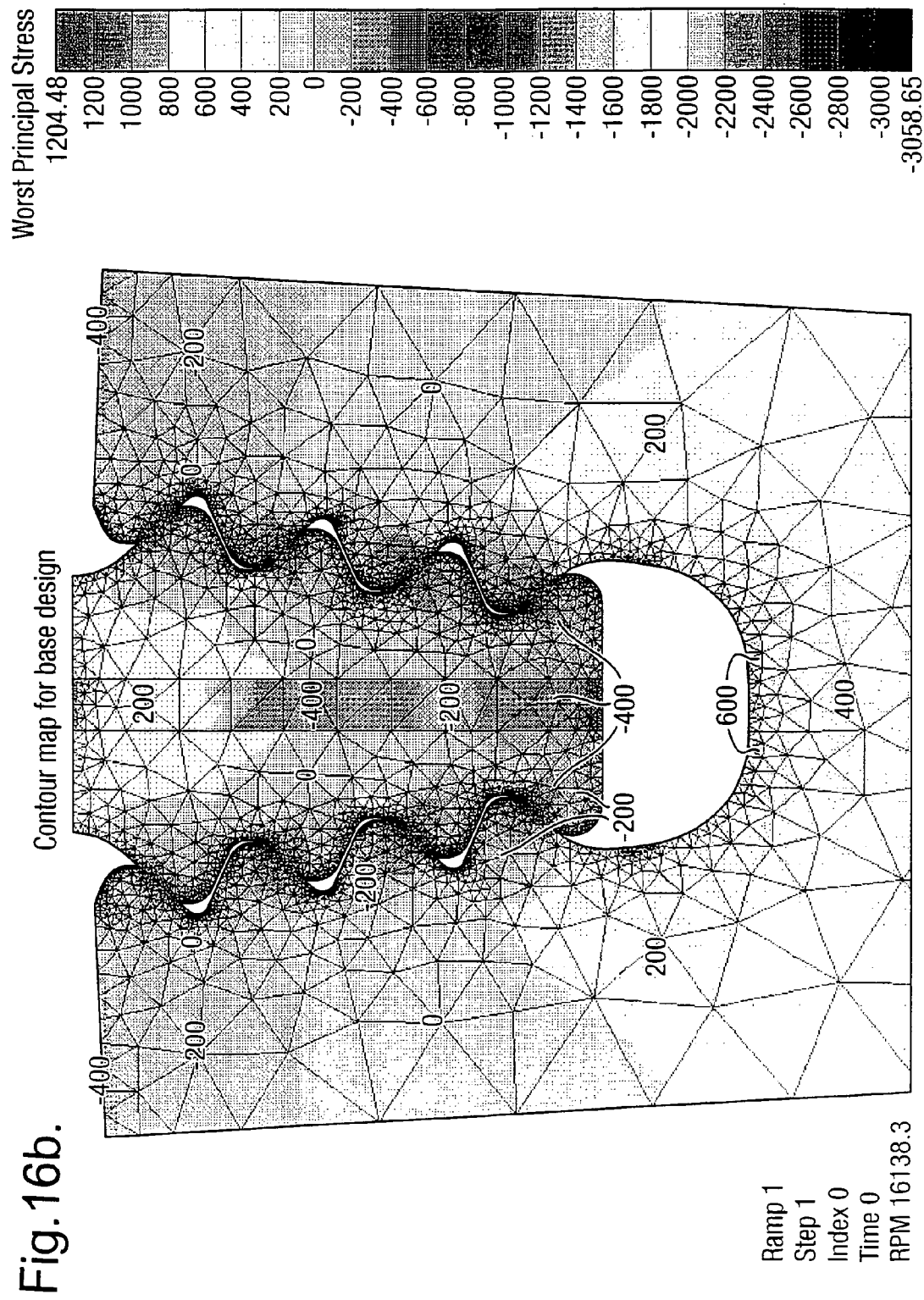

Although minimising the frontal area, and thus the rim-load will reduce overall weight, the life of blade/disk is highly dependent on the notch stresses, and so the notch stress may be minimised to achieve required life targets. Therefore, following the search on the full scale problem shown in FIG. 16*a*, a second optimisation problem to minimize the maximum notch stress has been carried out, starting from the best design found in the previous search. It is expected that this search will drive the geometry in a different direction given the changed goal. The result is shown in FIG. 16*b*. In this case only the six tooth profile parameters were chosen as design variables. It can be seen that although a 25% reduction in the maximum notch stress can be achieved, the fir-tree area is now increased by approximately 11%. Also note that the root wedge angle has dropped significantly while the pitch and all the radii have risen. Clearly, the choice of objective function has significant impact on the final design.

The generative modelling facility provided by the ICAD system enables the rapid evaluation of different design alternatives in an engineering environment. Incorporating such capabilities into a FEA-based structural optimisation process has been shown to be an effective way to reduce design time scales and at the same time improve the quality of the end product. Other information such as cost evaluation or manufacturing requirements could be further included without sacrificing the compatibility of the existing model. A complete and consistent product model could then be achieved to be set up for evaluation in the design optimisation process.

The invention claimed is:

1. A method of using a data processor for optimizing a design of a component, in which method principal design variants are generated, the principal design variants having design parameters which are common to principal design variants and having design variables which differ between the principal design variants, the method comprising;
  a) inputting a first principal design variant to said data processor and generating, by means of a rule-based geometry means, at least one secondary design variant from said first principal design variant,
  b) analyzing the design variants to generate analysis results,
  c) subjecting the analysis results to an optimization process, and
  d) iterating steps a) to c) a desired number of times in said data processor, and in each such iteration, changing a design variable to generate a further principal design variant which replaces said first principal design variant, wherein said optimization process comprises a first stage employing a genetic algorithm, and a second stage employing a gradient search algorithm.

2. A method as claimed in claim 1, wherein said at least one secondary design variant is derived from the first principal design variant by applying a mathematical operation to at least one of the design parameters or at least one of the design variables of the principal design variants.

3. A method as claimed in claim 1, wherein said analyzing the design variants comprises a finite element analysis, involving applying input conditions to determine the behavior of the design variants.

4. A method as claimed in claim 1, wherein the at least one secondary design variant represents a component made to the design at a tolerance limit.

5. A method as claimed in claim 1, wherein the at least one secondary design variant represents a component failure.

6. A method as claimed in claim 1, wherein the at least one secondary design variant represents damage to a component made to the design.

7. A method as claimed in claim 1, wherein the at least one secondary design variant represents a simplified geometry based on feature or dimension reduction.

8. A method as claimed in claim 1, in which the component is a component of a gas turbine engine.

9. A method as claimed in claim 8, in which the component is a blade for a gas turbine engine, said blade having a fir tree root.

10. A method of using a data processor for optimizing a design of a component, comprising;
  a) inputting in a data processor, to a rule-based geometry means, a design file, which includes a plurality of design variables, and the rule-based geometry means generating from said design file a plurality of geometry design variants,
  b) analyzing models based upon said design variants to generate analysis results,
  c) subjecting the analysis results to an optimization process, and
  d) iterating steps a) to c) a desired number of times in said data processor, and in each such iteration, changing one of said design variable within said design file, wherein said optimization process comprises a first stage employing a genetic algorithm, and a second stage employing a gradient search algorithm.

11. Apparatus for optimizing a design of a component, comprising;
  a) database means for storing design parameters which are common to design variants, and for storing design variables which differ between the design variants, and the database means for providing an output comprising a design file which includes a plurality of design variables,
  b) a rule-based geometry means for receiving said design file and for generating from said design file a plurality of geometry design variants,
  c) analysis means for analyzing models based upon said design variants to generate analysis results,
  d) optimization means for subjecting the analysis results to an optimization process, and
  e) control loop means for coupling said optimization means to said rule-based geometry means, for modifying a design variable in said design file, and for enabling iteration a desired number of times in said apparatus of items b), c) and d), wherein said optimization means includes genetic algorithm means, and gradient search means.

12. Apparatus according to claim 11 wherein said rule-based geometry means comprise an ICAD system for generating a geometry file containing said geometry design variants.

13. Apparatus according to claim 11 wherein said analysis means comprises finite element analysis means.

14. A method of using a data processor for optimizing a design of a component, in which method principal design variants are generated, the principal design variants having design parameters which are common to principal design variants and having design variables which differ between the principal design variants, the method comprising;
   a) inputting a first principal design variant to said data processor and generating, by means of a rule-based geometry means, at least one secondary design variant from said first principal design variant,
   b) analyzing the design variants to generate analysis results,
   c) subjecting the analysis results to an optimization process, and
   d) iterating steps a) to c) a desired number of times in said data processor, and in each such iteration, changing a design variable to generate a further principal design variant which replaces said first principal design variant, wherein the component is a blade for a gas turbine engine, said blade having a fir tree root and said blade attached by said fir tree root to a disk having a last continuous radius, wherein the optimization process minimizes the area outside the last continuous radius of said disk to which said blade is attached by its fir tree root.

15. A method as claimed in claim 14 wherein the optimization process comprises a first stage employing a genetic algorithm and a second stage employing a gradient search algorithm.

16. A method of using a data processor for optimizing a design of a component, in which method principal design variants are generated, the principal design variants having design parameters which are common to principal design variants and having design variables which differ between the principal design variants, the method comprising;
   a) inputting a first principal design variant to said data processor and generating, by means of a rule-based geometry means, at least one secondary design variant from said first principal design variant,
   b) analyzing the design variants to generate analysis results,
   c) subjecting the analysis results to an optimization process, and
   d) iterating steps a) to c) a desired number of times in said data processor, and in each such iteration, changing a design variable to generate a further principal design variant which replaces said first principal design variant, wherein the component is a blade for a gas turbine engine, said blade having a fir tree root, an optimum tooth profile and a maximum notch stress, wherein the optimization process determines the optimum tooth profile to minimize the maximum notch stress.

17. A method as claimed in claim 16 wherein the optimization process comprises a first stage employing a genetic algorithm and a second stage employing a gradient search algorithm.

18. A method of using a data processor for optimizing a design of a component, in which method principal design variants are generated, the principal design variants having design parameters which are common to principal design variants and having design variables which differ between the principal design variants, the method comprising;
   a) inputting a first principal design variant to said data processor and generating, by means of a rule-based geometry means, at least one secondary design variant from said first principal design variant,
   b) analyzing the design variants to generate analysis results,
   c) subjecting the analysis results to an optimization process, and
   d) iterating steps a) to c) a desired number of times in said data processor, and in each such iteration, changing a design variable to generate a further principal design variant which replaces said first principal design variant, in which the component is a turbine blade having a fir tree root and said blade attached by said fir tree root to a turbine disk having a last continuous radius, wherein the optimization process minimizes the area outside the last continuous radius of the turbine disk.

19. A method as claimed in claim 18 wherein the optimization process comprises a first stage employing a genetic algorithm and a second stage employing a gradient search algorithm.

20. A method of using a data processor for optimizing a design of a component, in which method principal design variants are generated, the principal design variants having design parameters which are common to principal design variants and having design variables which differ between the principal design variants, the method comprising;
   a) inputting a first principal design variant to said data processor and generating, by means of a rule-based geometry means, at least one secondary design variant from said first principal design variant,
   b) analyzing the design variants to generate analysis results,
   c) subjecting the analysis results to an optimization process, and
   d) iterating steps a) to c) a desired number of times in said data processor, and in each such iteration, changing a design variable to generate a further principal design variant which replaces said first principal design variant, in which the component is a turbine blade having a fir tree root, an optimum tooth profile and a maximum notch stress, wherein the optimization process determines the optimum tooth profile to minimize the maximum notch stress.

21. A method as claimed in claim 20 the optimization process comprises a first stage employing a genetic algorithm and a second stage employing a gradient search algorithm.

* * * * *